United States Patent
Huang

(10) Patent No.: US 6,696,894 B1
(45) Date of Patent: Feb. 24, 2004

(54) OPERATIONAL AMPLIFIER WITH INDEPENDENT INPUT OFFSET TRIM FOR HIGH AND LOW COMMON MODE INPUT VOLTAGES

(75) Inventor: Yuhong Huang, Mountain View, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/192,189

(22) Filed: Jul. 8, 2002

Related U.S. Application Data

(60) Provisional application No. 60/388,288, filed on Jun. 12, 2002.

(51) Int. Cl.[7] .................................................. H03F 3/45
(52) U.S. Cl. ............................ 330/253; 330/258; 330/9
(58) Field of Search ............................ 330/9, 253, 254, 330/258, 259; 327/307, 65, 66, 562, 563

(56) References Cited

U.S. PATENT DOCUMENTS 6,194,962 B1 * 2/2001 Chen ............................... 330/9
6,522,200 B2 * 2/2003 Siniscalchi ................... 330/254

OTHER PUBLICATIONS

Analog Devices, Precision CMOS single Swupply Rail–to–Rail—Input/Output Wideband Operational Amplifiers, AD8601/AD8602/AD8604, 2000, pp. 1–16.

* cited by examiner

Primary Examiner—Long Nguyen
(74) Attorney, Agent, or Firm—Koppel, Jacobs, Patrick & Heybl

(57) ABSTRACT

An operational amplifier provides independent trimming of $V_{os}$ for both high and low common mode input voltages. The amplifier includes complementary input pairs, and employs a steering circuit which provides a tail current $I_{tail}$ to one pair when $V_{cm}$ is less than a threshold voltage $V_{th}$, and provides $I_{tail}$ to the other pair when $V_{cm} > V_{th}$. The input pairs drive a load stage which includes one or more trim inputs that enable $V_{os}$ to be varied with one or more trim signals applied to the trim inputs. A first trim signal generating circuit provides a first trim signal only when $V_{cm} < V_{th}$, and a second trim signal generating circuit provides a second trim signal to a trim input only when $V_{cm} > V_{th}$. This allows the input offset voltages at high and low $V_{cm}$ to be adjusted independently.

8 Claims, 3 Drawing Sheets

OPERATIONAL AMPLIFIER WITH INDEPENDENT INPUT OFFSET TRIM FOR HIGH AND LOW COMMON MODE INPUT VOLTAGES

This application claims the benefit of provisional patent application No. 60/388,288 to Huang, filed Jun. 12, 2002.

BACKGROUND OF THE INVENTION

1. Field of the Invention

This invention relates to the field of trim circuits, and particularly to trim circuits for operational amplifiers which employ complementary input pairs to achieve a rail-to-rail common mode input range.

2. Description of the Related Art

Operational amplifiers have an associated parameter, referred to as input offset voltage ($V_{os}$), which specifies the op amp's differential input voltage applied to the amplifier's input terminals when the output voltage or current is zero. $V_{os}$ is zero for an ideal amplifier. To reduce $V_{os}$, some op amps provide one or more "trim" inputs; applying appropriate currents or voltages to the trim inputs reduces $V_{os}$.

One example of an op amp with a trimmable $V_{os}$ is shown in FIG. 1; this approach is described in U.S. Pat. No. 6,194,962 to Chen. The op amp's input consists of a first differential transistor pair MN1 and MN2, and a complementary differential transistor pair MP1 and MP2; both input pairs are connected to receive a differential input signal applied to input terminals V+ and V−. MN1 and MN2 are biased with a tail current source 10 and MP1 and MP2 receive a tail current from a source 12. In responding to the differential input voltage, each input pair produces a differential current that feeds in to a folded cascode stage 14, which produces an output current $I_{out}$ that varies with the differential currents received from the input pairs. A pair of trim inputs TRIM1 and TRIM2 are connected to respective nodes of the folded cascode stage 14.

In operation, the PMOS input pair (MP1, MP2) is active when the input common mode voltage ($V_{cm}$) is low (below a pre-set threshold voltage), and the NMOS input pair is active when $V_{cm}$ is high (above the pre-set threshold voltage). When a low $V_{cm}$ is applied to the op amp, a first correction current $\Delta I1$ is applied to TRIM1 or TRIM2 to reduce $V_{os}$ to zero. The correction provided by $\Delta I1$ is given by $\Delta I1/gmp$, where gmp is the transconductance of PMOS transistors MP1 and MP2; correction current $\Delta I1$ is applied throughout the entire common mode input range. After $\Delta I1$ has been set, a high $V_{cm}$ is applied to the op amp, and a second correction current $\Delta I2$ is applied to TRIM1 or TRIM2 (with $\Delta I1$ still applied) to reduce $V_{os}$. Thus, for a high $V_{cm}$, the correction provided by $\Delta I1$ and $\Delta I2$ is given by $(\Delta I1+\Delta I2)/gmn$, where gmn is the transconductance of NMOS transistors MN1 and MN2, since $\Delta I1$ is present throughout the entire common mode input range, while $\Delta I2$ is only present at high $V_{cm}$.

This approach has several disadvantages. For example, the trim range for a high $V_{cm}$ offset has to be larger than the untrimmed offset range, due to the effect of the low $V_{cm}$ correction current $\Delta I1$. For example, if the untrimmed offset for both high $V_{cm}$ and low $V_{cm}$ has a range of ±2.5 mV, the trim range for low $V_{cm}$ can the be set at ±2.5 mV, but the trim range for a high $V_{cm}$ has to be set at ±5 mV. In addition, any supply voltage or $V_{cm}$ dependent mismatch of $\Delta I1$ and $\Delta I2$ leads to a supply/$V_{cm}$ dependence for the post-trim trim $V_{os}$ at high $V_{cm}$. This approach also places a constraint on the procedure used to calibrate the op amp, requiring that the calibration be done in a prescribed sequence.

SUMMARY OF THE INVENTION

An operational amplifier is presented which overcomes the problems noted above.

The present op amp provides independent trimming of $V_{os}$ for both high and low common mode input voltages. The amplifier includes complementary input pairs, and employs a steering circuit which provides a tail current $I_{tail}$ to one input pair when $V_{cm}$ is less than a threshold voltage $V_{th}$, and provides $I_{tail}$ to the other input pair when $V_{cm}$ is greater than $V_{th}$. The input pairs produces an output current $I_{out}$ through a load stage; $I_{out}$ varies with the pairs' differential output currents. The load stage, which is preferably a folded cascode stage, includes one or more trim inputs which enable $V_{os}$ to be varied with one or more trim signals applied to the trim inputs. A first trim signal generating circuit provides a first trim signal to a trim input only when $V_{cm}$ is less $V_{th}$, and a second trim signal generating circuit provides a second trim signal to a trim input only when $V_{cm}$ is greater than $V_{th}$. This allows the input offset voltages at high and low $V_{cm}$ to be adjusted independently, thereby avoiding the problems identified above.

In a preferred embodiment, the steering circuit includes a steering transistor which steers tail current to a PMOS input pair when $V_{cm}$ is less than a threshold voltage $V_{th}$, and to a NMOS input pair via a current mirror circuit when $V_{cm}>V_{th}$. A first trim signal generating circuit generates a first trim signal, suitable for trimming $V_{os}$ at low $V_{cm}$ (PMOS pair active), by mirroring a fixed bias current to a first digital-to-analog converter (DAC) which produces the first trim signal in response. A second trim signal generating circuit generates a second trim signal suitable for trimming $V_{os}$ at high $V_{cm}$ (NMOS pair active) when tail current is steered to the NMOS input pair. A diverting circuit is connected to divert the fixed bias current when tail current is steered to the NMOS input pair, such that the first trim signal is reduced to zero. In this way, the first trim signal can be tailored to trim $V_{os}$ at low $V_{cm}$, the second trim signal trims $V_{os}$ at high $V_{cm}$, and each trim signal can be independently varied without affecting the other.

Further features and advantages of the invention will be apparent to those skilled in the art from the following detailed description, taken together with the accompanying drawings.

DETAILED DESCRIPTION OF THE INVENTION

Figure 2:
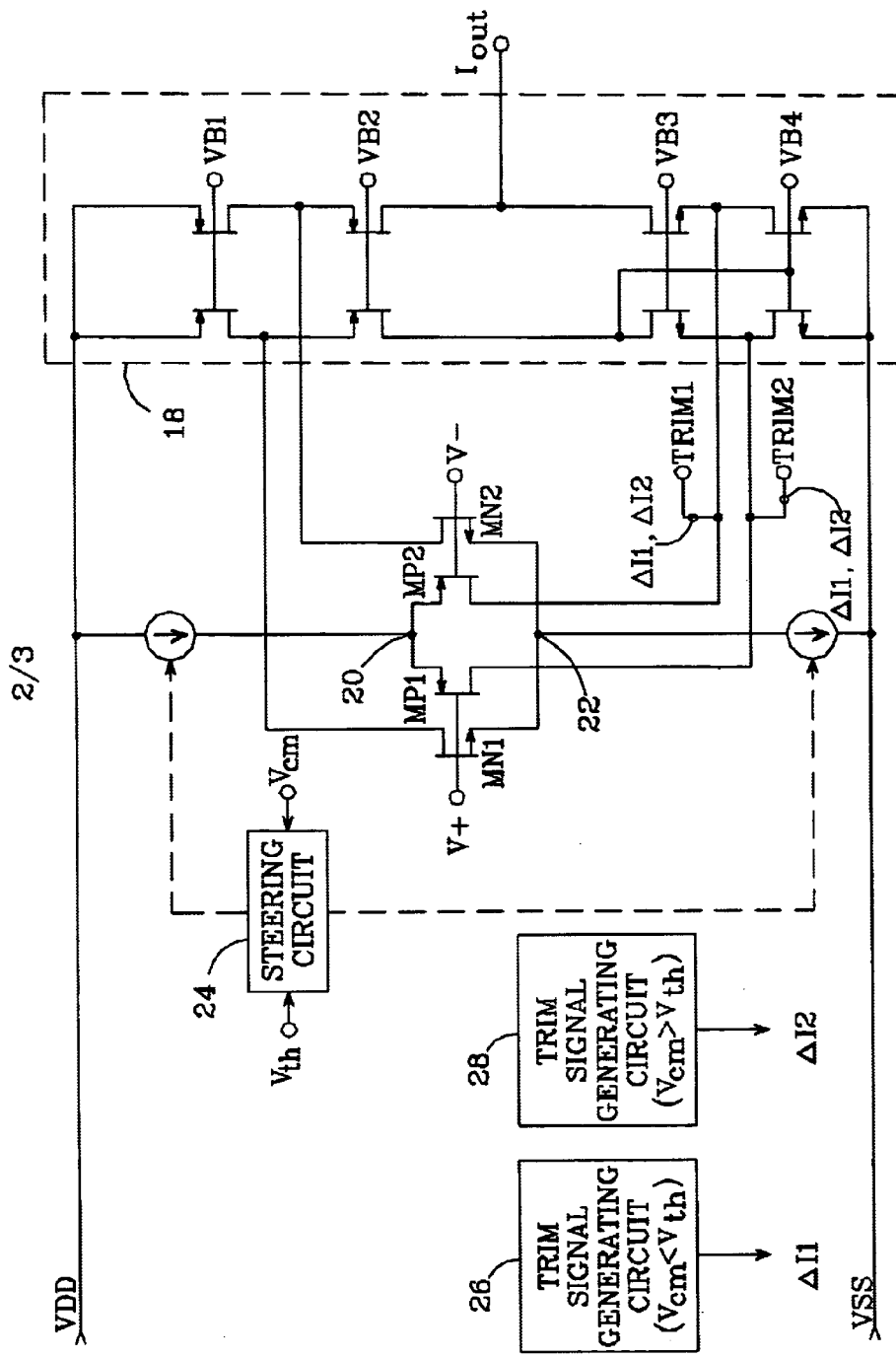
FIG. 2 is a block/schematic diagram which illustrates the basic principles of an op amp with independent input offset trim for high and low common mode input voltages per the present invention.

The principles of an operational amplifier with independent input offset trim for high and low common mode input voltages are illustrated in FIG. 2. As before, the op amp includes complementary input pairs: an NMOS pair MN1, MN2, and a PMOS pair MP1, MP2; each is connected to receive a differential input signal at input terminals V+ and V−. The PMOS' sources are connected together at a common mode node 20, and the NMOS' sources are connected together at a common mode node 22. Each input pair produces a differential current that is fed to a load stage 18—preferably implemented as a folded cascode stage—which produces an output current $I_{out}$ that varies with the input voltage applied to the input pairs. Load stage 18 includes at least one trim input (two trim inputs, TRIM1 and TRIM2, are shown in the exemplary embodiment shown in FIG. 2), and is arranged such that the op amp's input offset voltage $V_{os}$ can be varied by applying one or more trim signals to the trim inputs.

The op amp includes a steering circuit 24, which is arranged to provide tail current to one or the other of the input pairs depending on the relationship between the differential input signal's common mode input voltage $V_{cm}$ and a threshold voltage $V_{th}$. Steering circuit 24 provides a tail current $I_{tail}$ to common mode node 20 when $V_{cm}$ is less than $V_{th}$, and provides $I_{tail}$ to common mode node 22 when $V_{cm}$ is greater than $V_{th}$.

The op amp also includes a first trim signal generating circuit 26 and a second trim signal generating circuit 28. Circuit 26 is arranged to provide a first trim signal $\Delta I1$ to at least one of the op amp's trim inputs only when $V_{cm}$ is less than $V_{th}$. Similarly, circuit 28 is arranged to provide a second trim signal $\Delta I2$ to at least one of the op amp's trim inputs only when $V_{cm}$ is greater than $V_{th}$. The trim signal generating circuits are arranged such that first trim signal $\Delta I1$ is set to trim $V_{os}$ for a low $V_{cm}$, and second trim signal $\Delta I2$ is set to trim $V_{os}$ for a high $V_{cm}$.

The present op amp is arranged such that trim signals $\Delta I1$ and $\Delta I2$ can be independently varied without affecting the other. This provides several advantages over the prior art approach described above. The trim range for a high $V_{cm}$ offset is no longer required to be widened because of the adverse effect of the low $V_{cm}$ trim signal—the trim ranges can be set solely by the untrimmed offset voltage range for both high and low common mode input voltages. The independent trim signal generating circuits eliminate problems caused by supply voltage or $V_{cm}$ dependent mismatch of $\Delta I1$ and $\Delta I2$, and remove constraints that were previously imposed on the amplifier's calibration procedure.

Figure 3:
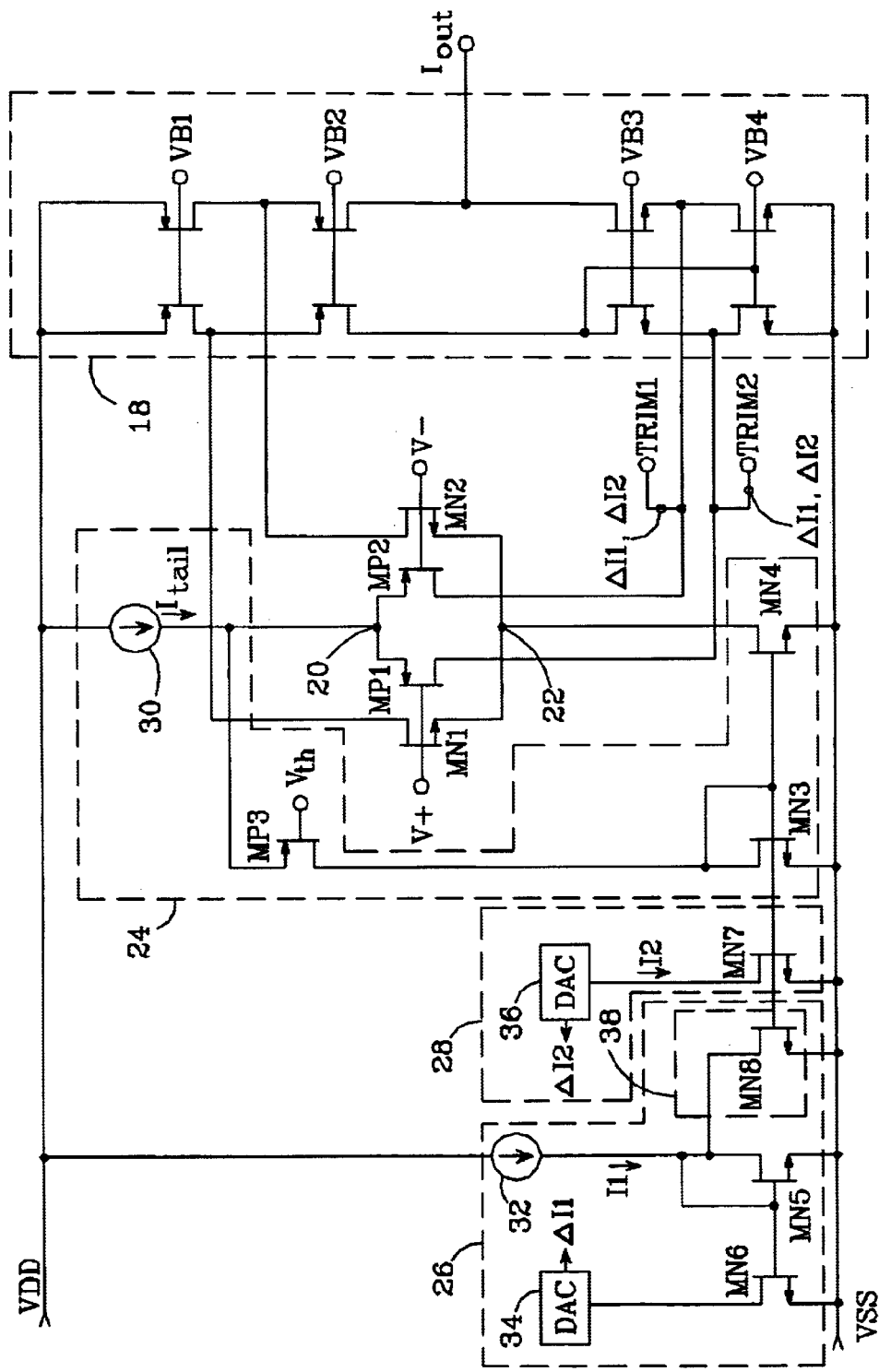
FIG. 3 is a schematic diagram of a preferred embodiment of an op amp with independent input offset trim for high and low common mode input voltages per the present invention.

A preferred embodiment of the present invention is shown in FIG. 3. Here, steering circuit 24 is made from a fixed current source 30 which outputs tail current $I_{tail}$, a steering transistor MP3, and a current mirror made from an input transistor MN3 and an output transistor MN4. Steering transistor MP3 has its source-drain circuit connected between common mode node 20 and current mirror input transistor MN3, and its gate connected to a bias voltage $V_{th}$. When so arranged, when $V_{cm}<V_{th}$, steering transistor MP3 is off and $I_{tail}$ is provided to common mode node 20 and the PMOS input pair. When $V_{cm}>V_{th}$, steering transistor MP3 is on and conducts $I_{tail}$ to the current mirror, which mirrors the tail current to common mode node 22 and the NMOS input pair.

Trim signal generating circuit 26 is preferably made from a fixed current source 32 which outputs a bias current I1, a current mirror made from an input transistor MN5 and an output transistor MN6, and a DAC 34. The MN5/MN6 current mirror mirrors I1 to the reference current input of DAC 34. In response to the mirrored current, DAC 34 produces correction current $\Delta I1$, which is connected to one of the trim inputs of load stage 18.

Trim signal generating circuit 28 is preferably made from a transistor MN7 connected to conduct a current I2 when steering transistor MP3 steers $I_{tail}$ to the MN3/MN4 current mirror, and a DAC 36. Current I2 is applied to the reference current input of DAC 36, which produces correction current $\Delta I2$ in response; $\Delta I2$ is connected to one of the trim inputs of load stage 18. Since I2 is only present when steering transistor MP3 steers $I_{tail}$ to the MN3/MN4 current mirror (i.e., when $V_{cm}>V_{th}$), $\Delta I2$ is only generated when $V_{cm}>V_{th}$.

The operational amplifier also includes a diverting circuit 38, which is arranged to divert bias current $\Delta I1$ from the MN5/MN6 current mirror when steering transistor MP3 steers $I_{tail}$ to the MN3/MN4 current mirror, which serves to reduce or eliminate correction current $\Delta I1$. When so arranged, correction current $\Delta I1$ is reduced or eliminated when $V_{cm}>V_{th}$, such that correction current $\Delta I1$ is only generated when $V_{cm}<V_{th}$. Diverting circuit 38 preferably comprises a diverting transistor MN8 which is connected to the output of fixed current source 32 and in parallel with MN7. MN8 diverts current I1 away from the MN5/MN6 current mirror when steering transistor MP3 steers $I_{tail}$ to the MN3/MN4 current mirror; i.e, when $V_{cm}>V_{th}$. In this way, the drive current to DAC 34 is reduced or eliminated, as is correction current $\Delta I1$.

Diverting transistor MN8 is preferably sized to reduce current I1 (and thus correction current $\Delta I1$) to zero. For example, assume that tail current source 30 outputs 180 $\mu$A and trim signal generating circuit current source 32 outputs 10 $\mu$A (i.e., I1=10 $\mu$A). When $V_{cm}>V_{th}$, MP3 steers 180 $\mu$A to current mirror transistor MN3. To reduce I1 (and $\Delta I1$ to zero, MN8 needs to conduct at least 10 $\mu$A. To achieve this, MN8 and MN3 need to form a current mirror having a ratio of at least 1:18.

The op amp is preferably arranged with trim input TRIM1 as a "positive" trim input, such that the application of a positive trim signal $\Delta I1$ or $\Delta I2$ reduces a positive $V_{os}$, and with TRIM2 as a "negative" trim input which reduces a negative $V_{os}$ with the application of a positive trim signal $\Delta I1$ or $\Delta I2$. Alternatively, DACs 34 and 36 could each be designed to output positive or negative trim signals. In this case, only one trim input would be needed, to which both $\Delta I1$ and $\Delta I2$ would be connected.

Note that though the present operational amplifier has been illustrated as implemented exclusively with field-effect transistors (FETs), the invention is equally applicable to an implementation in which some or all of the transistors are bipolar.

Figure 1:
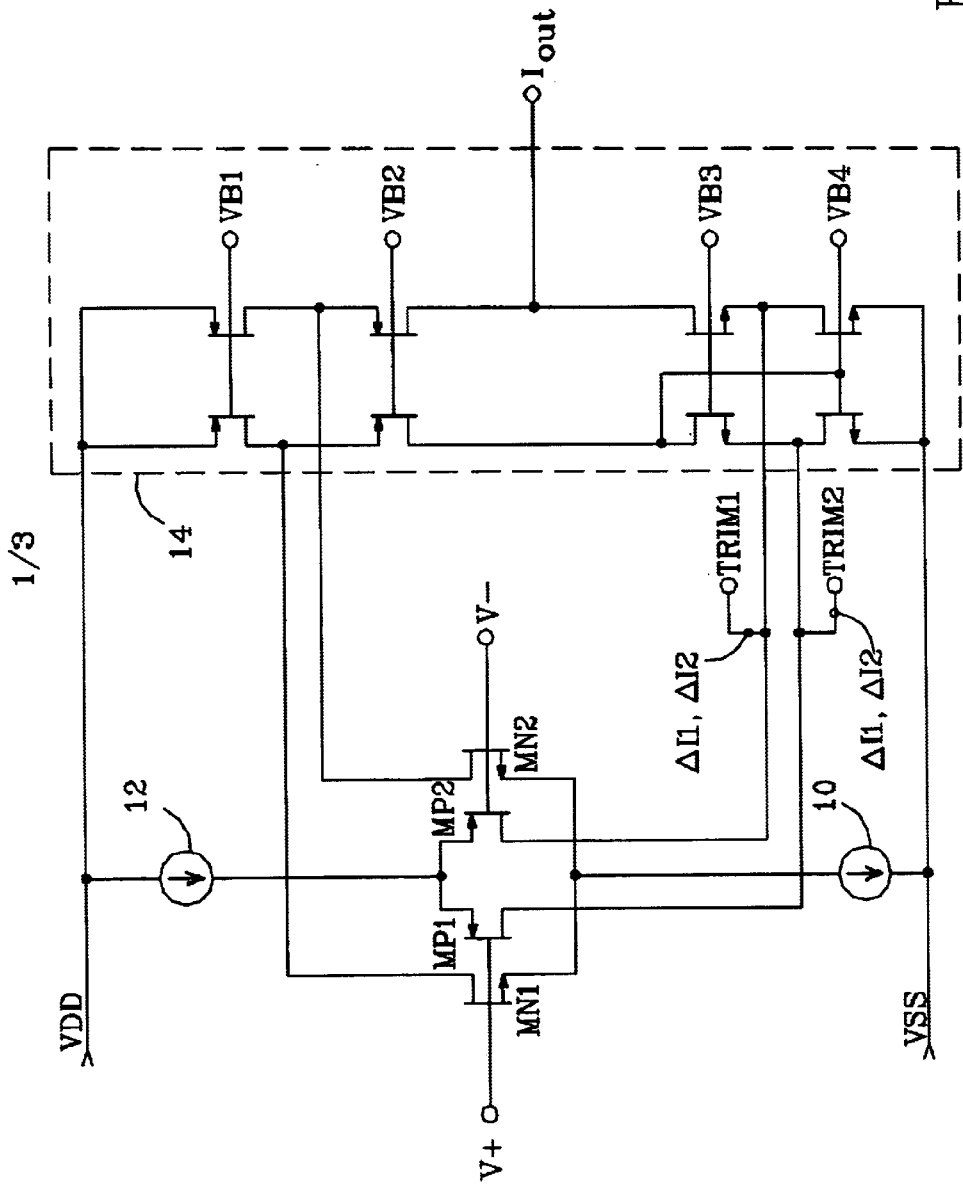
FIG. 1 is a schematic diagram of a known op amp with $V_{os}$ trim inputs.

Further note that the implementation shown in FIG. 3 is merely one possible way of implementing the invention. A number of mechanisms could be employed to ensure that $\Delta I1$ is generated only when $V_{cm}<V_{th}$, and that $\Delta I2$ is generated only when $V_{cm}>V_{th}$. In addition, the invention can be used with other load topologies: the implementation of load stage 18 shown in FIGS. 1–3 is merely exemplary.

The implementation shown in FIG. 3 can be a single-stage operational amplifier, or the first stage of a multi-stage operational amplifier.

While particular embodiments of the invention have been shown and described, numerous variations and alternate embodiments will occur to those skilled in the art. Accordingly, it is intended that the invention be limited only in terms of the appended claims.

I claim:

1. An operational amplifier having an associated input offset voltage and with independent input offset trim for common mode input voltages that are above and below a threshold voltage $V_{th}$, comprising:

an input stage, comprising:

a first differential transistor pair connected to receive a differential input signal having an associated common mode voltage ($V_{cm}$) and to produce a first differential output current which varies with said differential input signal, each transistor of said first differential transistor pair having a first conductivity and comprising a control input and first and second current terminals, the second current terminals of said first differential transistor pair connected together at a first common mode node, a second differential transistor pair, connected to receive said differential input signal and to produce a second differential output current which varies with said differential input signal, each transistor of said second differential transistor pair having a second conductivity opposite to said first conductivity and comprising a control input and first and second current terminals, the second current terminals of said second differential transistor pair connected together at a second common mode node, a steering circuit which, provides a tail current $I_{tail}$ to said first differential transistor pair at said first common mode node when the common mode voltage $V_{cm}$ of said differential input signal is less than the threshold voltage $V_{th}$ and to provide $I_{tail}$ to said second differential transistor pair at said second common mode node when $V_{cm}$ is greater than $V_{th}$, said steering circuit comprising:

a current source connected to provide $I_{tail}$ to said first common mode node, a steering transistor comprising a control input and first and second current terminals, having its second current terminal connected to said first common mode node and its control input connected to $V_{th}$ such that said steering transistor conducts a current in response to said threshold voltage, and a first current mirror connected to mirror the current conducted by said steering transistor to said second common mode node, a load stage arranged to produce an output current which varies with said first and second differential output currents, said load stage including at least one trim input and further arranged to vary the input offset voltage of said op amp with one or more trim signals applied to said at least one trim input, a first trim signal generating circuit arranged to provide a first one of said trim signals to said at least one trim input only when $V_{cm}<V_{th}$, and a second trim signal generating circuit arranged to provide a second one of said trim signals to said at least one trim input only when $V_{cm}>V_{th}$, wherein said first trim signal generating circuit receives a first bias current and produces said first trim signal in response to said first bias current, said op amp further comprising a diverting circuit which diverts said first bias current from said first trim signal generating circuit when $V_{cm}>V_{th}$ such that said first trim signal is reduced to zero.

2. The op amp of claim 1, wherein said second trim signal generating circuit receives a current which varies with the current conducted by said steering transistor and produces said second trim signal in response, such that said second trim signal is provided only when $V_{cm}>V_{th}$.

3. The op amp of claim 1, wherein said load stage is a folded cascode stage.

4. An operational amplifier having an associated input offset voltage and with independent input offset trim for common mode input voltages that are above and below a threshold voltage $V_{th}$, comprising:

an input stage, comprising:

a first differential transistor pair connected to receive a differential input signal having an associated common mode voltage ($V_{cm}$) and to produce a first differential output current which varies with said differential input signal, each transistor of said first differential transistor pair having a first conductivity and comprising a control input and first and second current terminals, the second current terminals of said first differential transistor pair connected together at a first common mode node, a second differential transistor pair connected to receive said differential input signal and to produce a second differential output current which varies with said differential input signal, each transistor of said second differential transistor pair having a second conductivity opposite to said first conductivity and comprising a control input and first and second current terminals, the second current terminals of said second differential transistor pair connected together at a second common mode node, and a steering circuit which provides a tail current $I_{tail}$ to said first differential transistor pair at said first common mode node when the common mode voltage $V_{cm}$ of said differential input signal is less than the threshold voltage $V_{th}$ and to provide $I_{tail}$ to said second differential transistor pair at said second common mode node when $V_{cm}$ is greater than $V_{th}$, said steering circuit comprising:

a current source connected to provide $I_{tail}$ to said first common mode node, a steering transistor comprising a control input and first and second current terminals, having its second current terminal connected to said first common mode node and its control input connected to $V_{th}$ such that said steering transistor conducts a current in response to said threshold voltage, and a first current mirror connected to mirror the current conducted by said steering transistor to said second common mode node, a load stage arranged to produce an output current which varies with said first and second differential output currents, said load stage including at least one trim input and further arranged to vary the input offset voltage of said op amp with one or more trim signals applied to said at least one trim input, a first trim signal generating circuit arranged to provide a first one of said trim signals to said at least one trim input only when $V_{cm}<V_{th}$, and a second trim signal generating circuit arranged to provide a second one of said trim signals to said at least one trim input only when $V_{cm}>V_{th}$, wherein said first trim signal generating circuit comprises:

a fixed current source which produces a first bias current, a first digital-to-analog converter (DAC) which produces said first trim signal in response to a current provided at said first DAC's reference current input, and a second current mirror which receives said first bias current and mirrors said first bias current to said DAC's reference current input, said second current trim signal generating circuit comprises:

a second digital-to-analog converter (DAC) which produces said second trim signal in response to a current provided at said second DAC's reference current input, and a transistor connected to mirror said current conducted by said steering transistor to said second DAC, said op amp further comprising a diverting transistor connected to the output of said fixed current source and arranged to mirror said current conducted by said steering transistor such that said first bias current is diverted from said second current mirror when $V_{cm}$ is greater than $V_{th}$.

5. The op amp of claim 4, wherein said diverting transistor is sized to divert all of said first bias current from said second current mirror such that said first trim signal is reduced to zero when $V_{cm}$ is greater than $V_{th}$.

6. An operational amplifier having an associated input offset voltage and with independent input offset trim for common mode input voltages that are above and below a threshold voltage $V_{th}$, comprising:

an input stage, comprising:
  a first differential transistor pair connected to receive a differential input signal having an associated common mode voltage ($V_{cm}$) and to produce a first differential output current which varies with said differential input signal, each transistor of said first differential transistor pair having a first conductivity and comprising a control input and first and second current terminals, the second current terminals of said first differential transistor pair connected together at a first common mode node,
  a second differential transistor pair, connected to receive said differential input signal and to produce a second differential output current which varies with said differential input signal, each transistor of said second differential transistor pair having a second conductivity opposite to said first conductivity and comprising a control input and first and second current terminals, the second current terminals of said second differential transistor pair connected together at a second common mode node,
  a steering circuit which provides a tail current $I_{tail}$ to said first differential transistor pair at said first common mode node when the common mode voltage $V_{cm}$ of said differential input signal is less than the threshold voltage $V_{th}$ and to provide $I_{tail}$ to said second differential transistor pair at said second common mode node when $V_{cm}>V_{th}$, said steering circuit comprising:
    a current source connected to provide $I_{tail}$ to said first common mode node,
    a steering transistor comprising a control input and first and second current terminals, having its second current terminal connected to said first common mode node and its control input connected to $V_{th}$ such that said steering transistor conducts a current in response to said threshold voltage, and
    a first current mirror connected to mirror the current conducted by said steering transistor to said second common mode node,
  a load stage arranged to produce an output current which varies with said first and second differential output currents, said load stage including at least one trim input and further arranged to vary the input offset voltage $V_{os}$ of said op amp with one or more trim signals applied to said at least one trim input,
  a first current generating circuit comprising:
    a fixed current source which produces a first bias current,
    a first digital-to-analog converter (DAC) which produces a first one of said trim signals to said at least one trim input in response to a current provided at its reference current input, and
    a second current mirror which receives said first bias current and mirrors said first bias current to said DAC's reference current input,
  a second current generating circuit comprising:
    a second digital-to-analog converter (DAC) which produces a second one of said trim signals to said at least one trim input in response to a current provided at its reference current input, and
    a transistor connected to mirror said current conducted by said steering transistor to said second DAC, and
    a diverting transistor connected to the output of said fixed current source and arranged to mirror said current conducted by said steering transistor such that said first bias current is diverted from said second current mirror when $V_{cm}>V_{th}$,
    said diverting transistor sized to divert said first bias current from said second current mirror such that said first trim signal is reduced to zero when $V_{cm}>V_{th}$.

7. The op amp of claim 6, wherein said load stage is a folded cascode stage.

8. The op amp of claim 6, wherein said load stage's trim inputs comprise a positive trim input and a negative trim input, such that a positive trim signal applied to said positive trim input reduces a positive $V_{os}$ and a positive trim signal applied to said negative trim input reduces a negative $V_{os}$.

* * * * *